(12) United States Patent
Kim et al.

(10) Patent No.: US 10,037,114 B2
(45) Date of Patent: Jul. 31, 2018

(54) TOUCH WINDOW

(71) Applicant: LG INNOTEK CO., LTD., Seoul (KR)

(72) Inventors: Seung Jin Kim, Seoul (KR); Jong Sun Kim, Seou (KR); Dong Mug Seong, Seoul (KR); Kyoung Jong Yoo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/126,647

(22) PCT Filed: May 7, 2015

(86) PCT No.: PCT/KR2015/004558
§ 371 (c)(1),
(2) Date: Sep. 16, 2016

(87) PCT Pub. No.: WO2015/174683
PCT Pub. Date: Nov. 19, 2015

(65) Prior Publication Data
US 2017/0097700 A1    Apr. 6, 2017

(30) Foreign Application Priority Data

May 12, 2014  (KR) .................. 10-2014-0056419
May 21, 2014  (KR) .................. 10-2014-0060763
(Continued)

(51) Int. Cl.
*G06F 3/044* (2006.01)
*G02F 1/1333* (2006.01)
(Continued)

(52) U.S. Cl.
CPC ............ *G06F 3/044* (2013.01); *G02F 1/1368* (2013.01); *G02F 1/13338* (2013.01);
(Continued)

(58) Field of Classification Search
CPC ....... G06F 3/044; G06F 3/0416; G06F 3/0412
See application file for complete search history.

(56) References Cited

U.S. PATENT DOCUMENTS

2011/0102370 A1  5/2011  Kono et al.
2013/0341070 A1* 12/2013  Kim .................. H05K 1/0213
                                                                  174/250

(Continued)

FOREIGN PATENT DOCUMENTS

KR  10-2012-0072187   7/2012
KR  10-2012-0074258   7/2012
(Continued)

OTHER PUBLICATIONS

International Search Report dated Jul. 17, 2015 issued in Application No. PCT/KR2015/004558.

*Primary Examiner* — Kevin M Nguyen
(74) *Attorney, Agent, or Firm* — KED & Associates, LLP

(57) ABSTRACT

A touch window according to an embodiment includes a substrate; a sensing electrode disposed on the substrate; and a wire electrode disposed on the substrate, wherein the at least one of the sensing electrode and the wire electrode is arranged in a form of a mesh.

12 Claims, 9 Drawing Sheets

(30) Foreign Application Priority Data

May 23, 2014 (KR) .................. 10-2014-0062104
Jan. 27, 2015 (KR) .................. 10-2015-0012927

(51) Int. Cl.
*G02F 1/1368* (2006.01)
*H01L 27/32* (2006.01)

(52) U.S. Cl.
CPC .............. *G06F 2203/04111* (2013.01); *G06F 2203/04112* (2013.01); *H01L 27/323* (2013.01); *H01L 27/3244* (2013.01)

(56) References Cited

U.S. PATENT DOCUMENTS

2014/0041999 A1   2/2014   Yim et al.
2014/0049485 A1   2/2014   Oh et al.

FOREIGN PATENT DOCUMENTS

KR          10-1169250       8/2012
KR          10-1202552      11/2012
KR     10-2013-0074933       7/2013

\* cited by examiner

[Fig. 1]
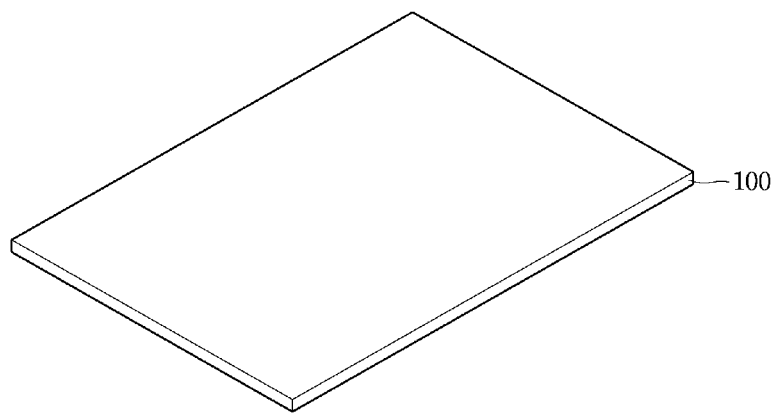
[Fig. 2]
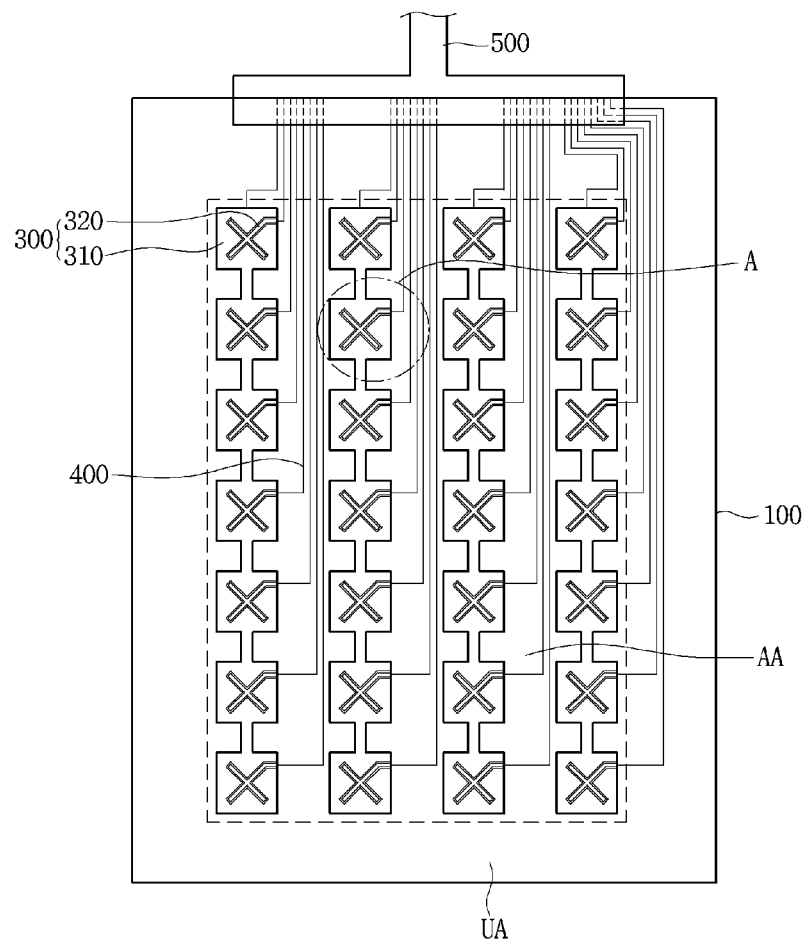

[Fig. 3]
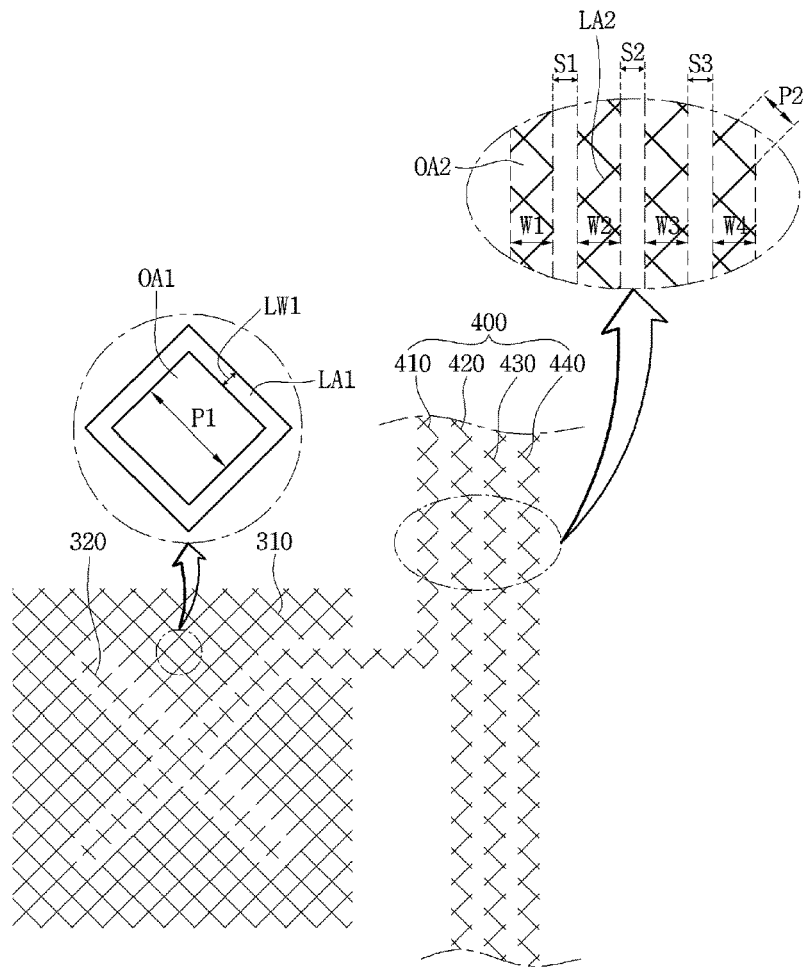
[Fig. 4]
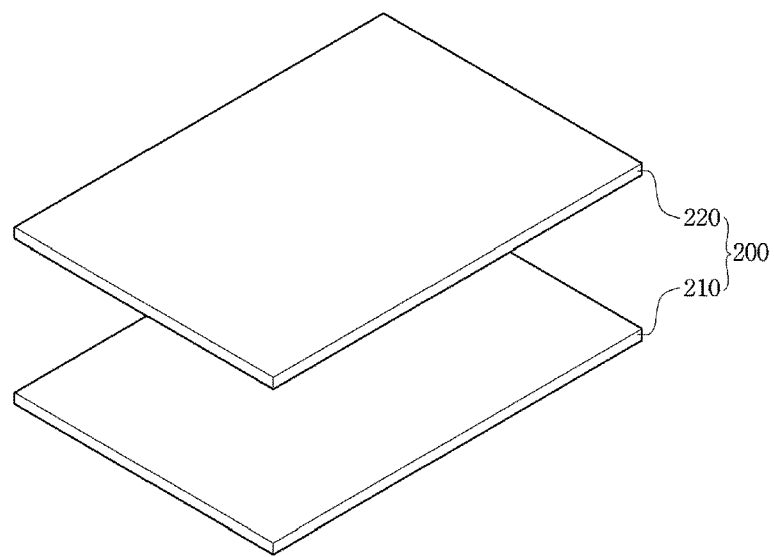

[Fig. 5]
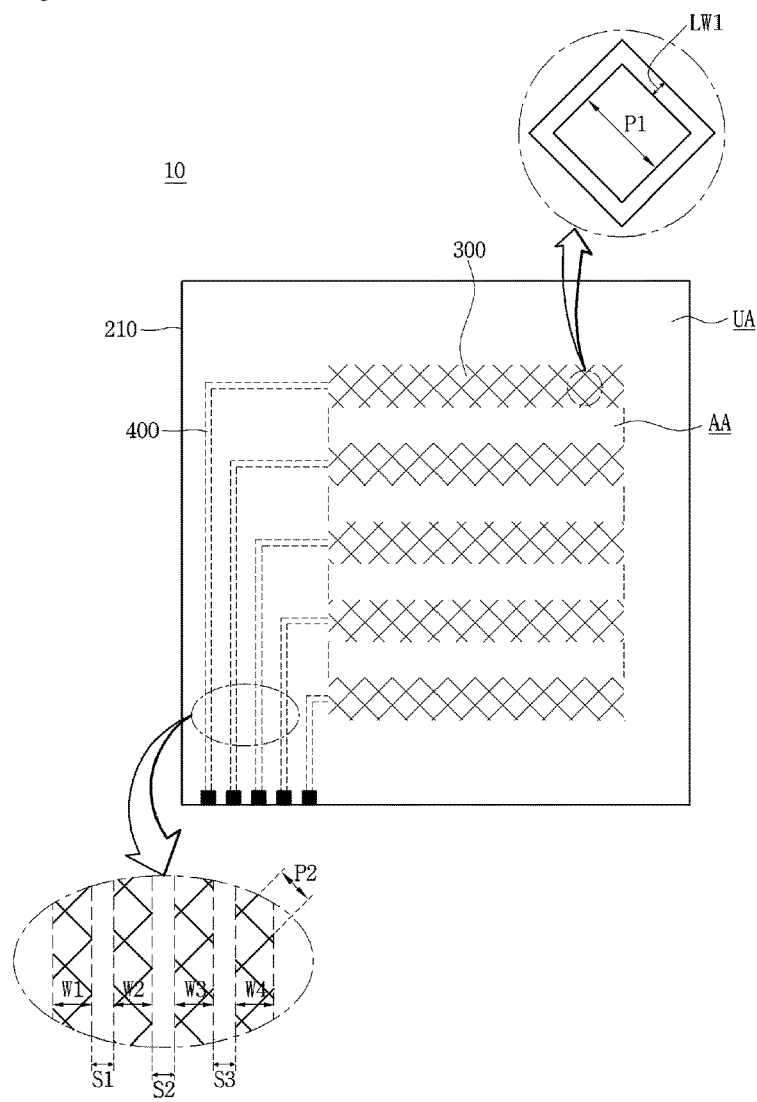
[Fig. 6]
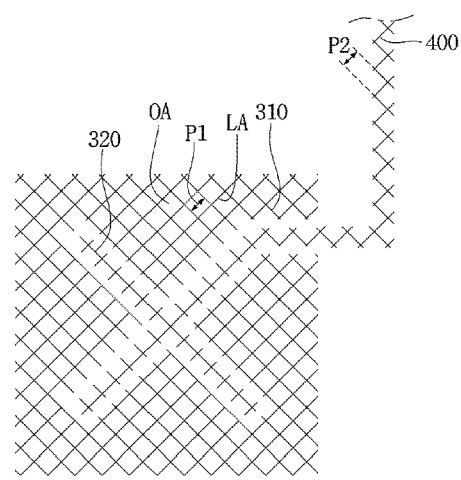

[Fig. 7]
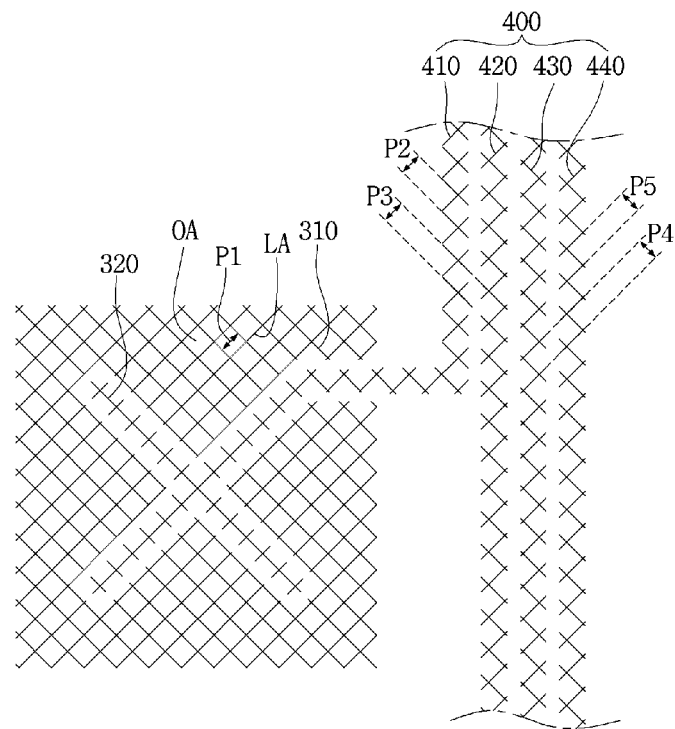
[Fig. 8]
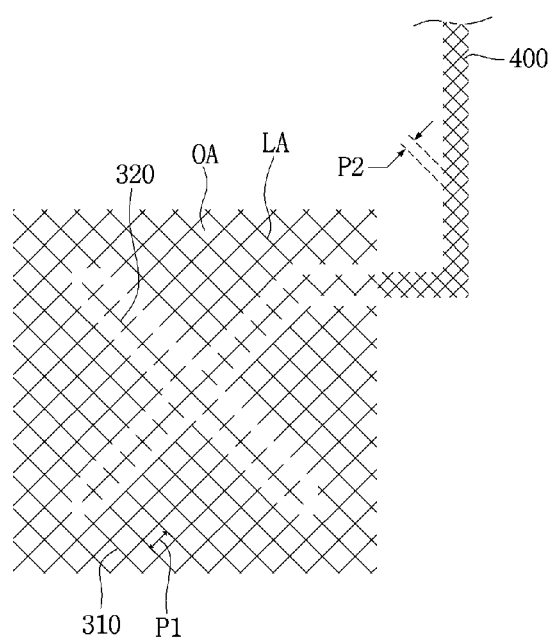

[Fig. 9]
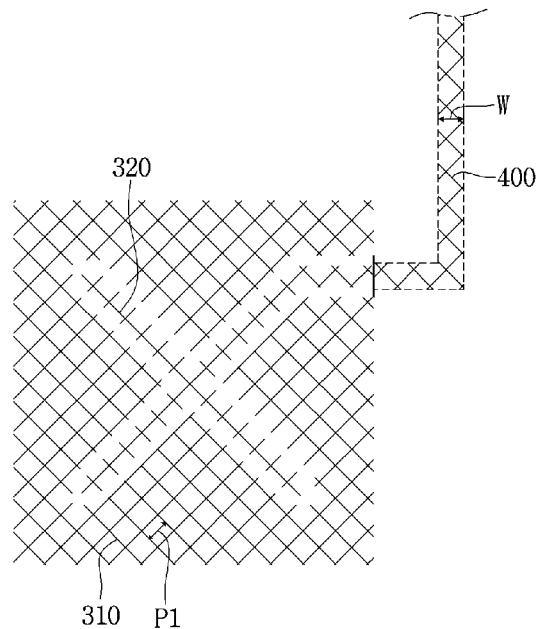
[Fig. 10]
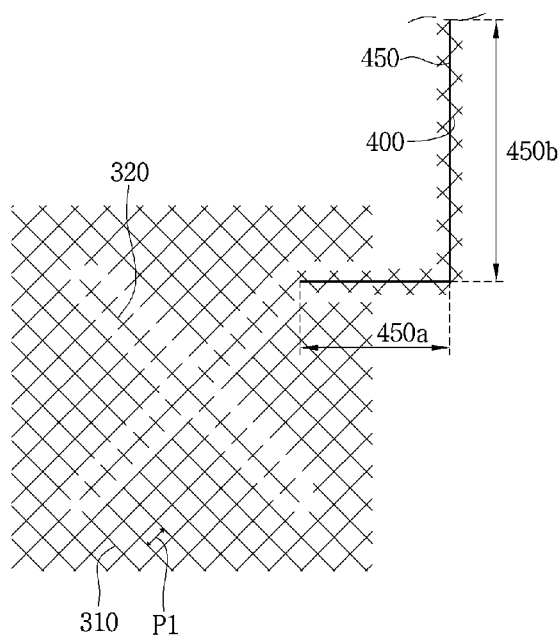

[Fig. 11]
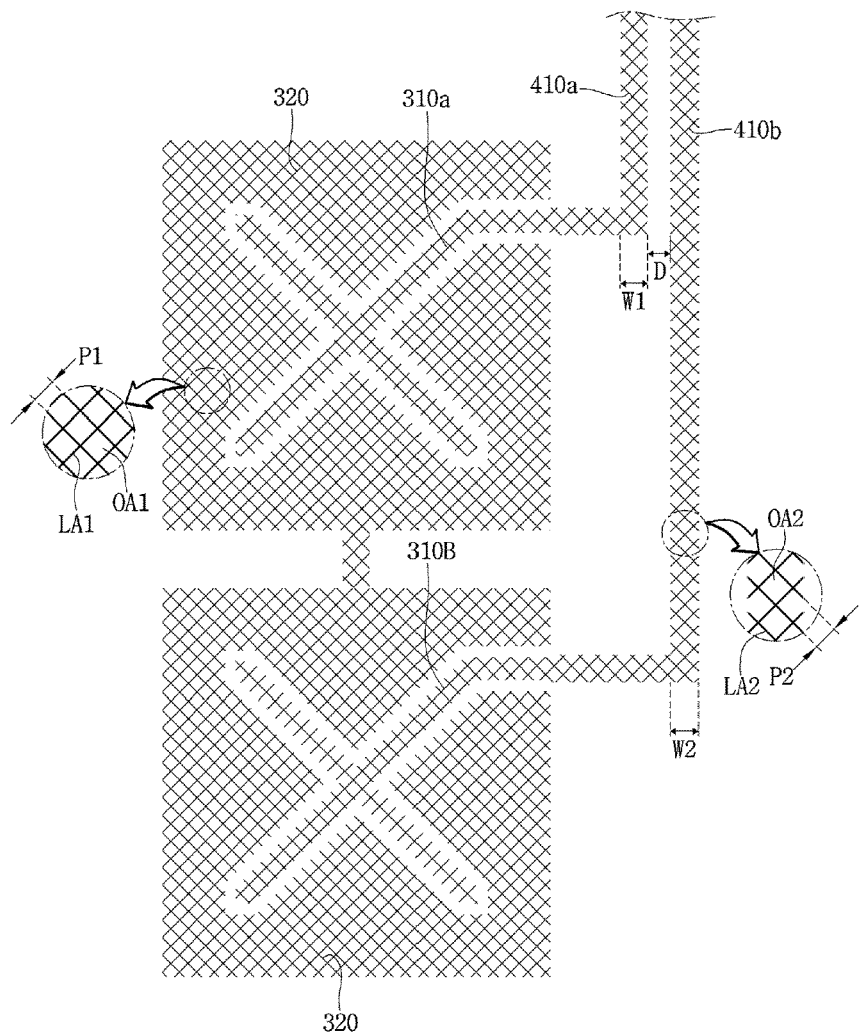
[Fig. 12]
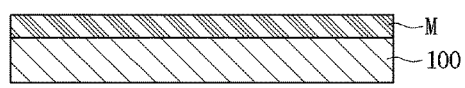

[Fig. 13]
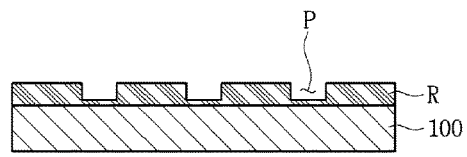
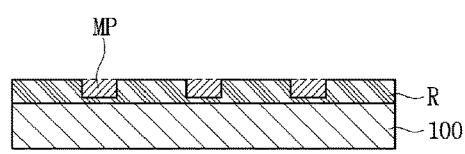
[Fig. 14]
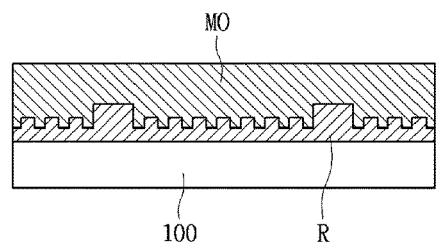
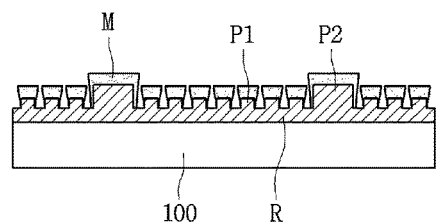
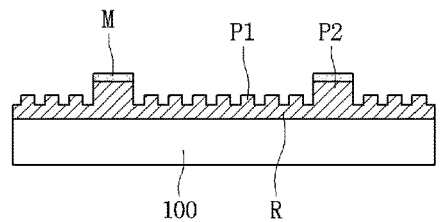

[Fig. 15]
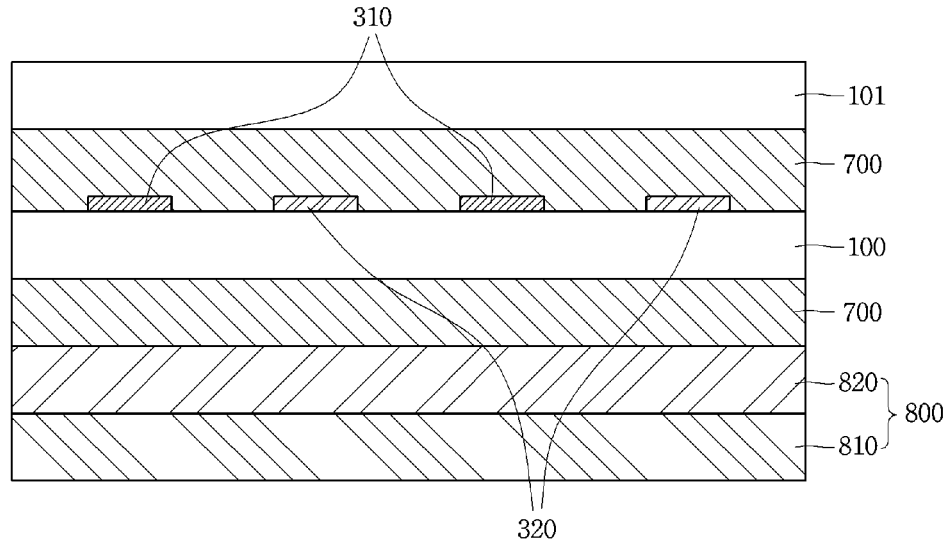
[Fig. 16]
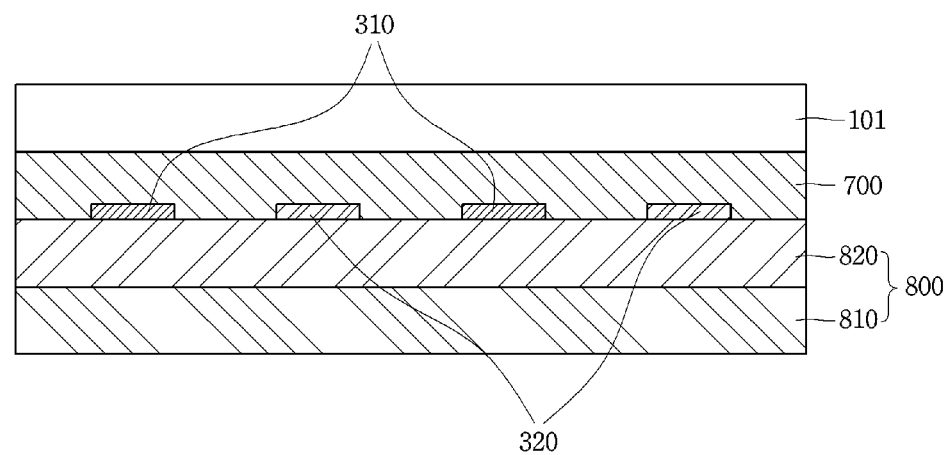
[Fig. 17]
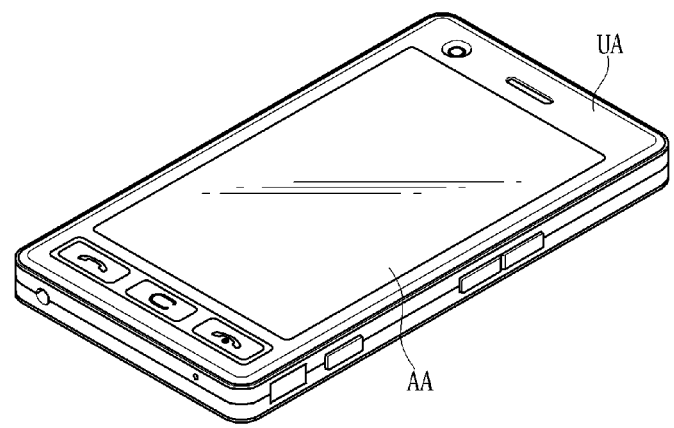

[Fig. 18]
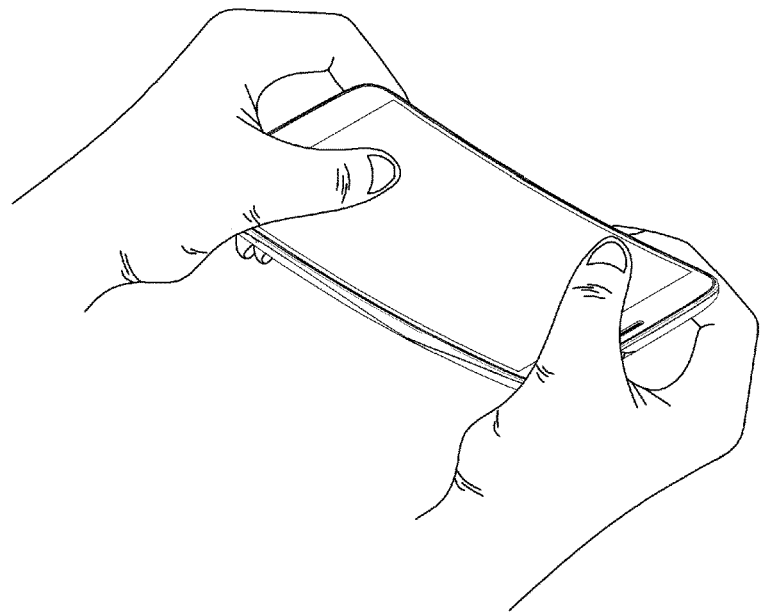
[Fig. 19]
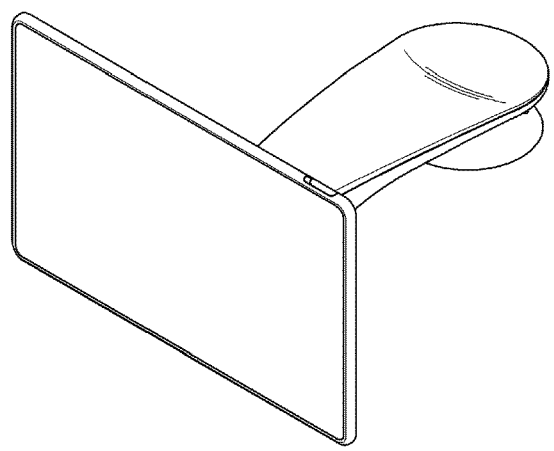
[Fig. 20]

TOUCH WINDOW

CROSS-REFERENCE TO RELATED PATENT APPLICATIONS

This application is a U.S. National Stage Application under 35 U.S.C. § 371 of PCT Application No. PCT/KR2015/004558, filed May 7, 2015, which claims priority to Korean Patent Application No. 10-2014-0056419, filed May 12, 2014, 10-2014-0060763, filed May 21, 2014, 10-2014-0062104, filed May 23, 2014, and 10-2015-0012927, filed Jan. 27, 2015, whose entire disclosures are hereby incorporated by reference.

TECHNICAL FIELD

The embodiment relates to a touch window.

BACKGROUND ART

Recently, a touch panel, which performs an input function through the touch of an image displayed on a display device by an input device such as a stylus pen or a hand, has been applied to various electronic appliances.

The touch panel may be representatively classified into a resistive touch panel and a capacitive touch panel. In the resistive touch panel, the position of the touch point is detected by detecting the variation of resistance according to the connection between electrodes when pressure is applied to the input device. In the capacitive touch panel, the position of the touch point is detected by detecting the variation of capacitance between electrodes when a finger of the user touches the capacitive touch panel. When taking into consideration the convenience of a fabrication scheme and a sensing power, the capacitive touch panel has been spotlighted in a smaller model touch panel recently.

According to the touch window, a sensing electrode and a wire electrode connected to the sensing electrode are disposed on a substrate, and when an area on which the sensing electrode is disposed is touched, the variation of capacitance is sensed so that the position of the touch point can be detected.

The sensing electrode or the wire electrode is disposed on a cover substrate and/or a substrate.

In this case, when the sensing electrode or the wire electrode is arranged in the form of a mesh, a mesh pattern of the sensing electrode or the wire electrode on an active area or an unactive area may be visually recognized from an outside.

That is, the mesh pattern of the sensing electrode or the wire electrode, which is formed of metal, may be visually recognized from the outside so the visibility may be reduced.

Therefore, a touch window having a new structure capable of solving the above problem is required.

DISCLOSURE OF INVENTION

Technical Problem

The embodiment provides a touch window having improved reliability and visibility.

Solution to Problem

A touch window according to an embodiment includes a substrate; a sensing electrode disposed on the substrate; and a wire electrode disposed on the substrate, wherein the at least one of the sensing electrode and the wire electrode is arranged in a form of a mesh.

Advantageous Effects of Invention

According to the touch window of the embodiment, a relationship between a mesh pitch and a mesh line width of the sensing electrode, a mesh pitch of the wire electrode, a mesh wire width, width and interval between wire electrodes can be defined by a predetermined equation.

According to the definition of the equation, the transmittance of the sensing electrode and the wire electrode arranged in the form of mesh may be improved so that the sensing electrode and the wire electrode cannot be visually recognized from an outside.

For this reason, the touch window according to the embodiment can improve the overall visibility.

In addition, the touch window according to the embodiment includes a wire electrode having a mesh pitch smaller than the mesh pitch of the sensing electrode. For example, the mesh pitch of the wire electrode according to the embodiment may be about 0.5 times the mesh pitch of the sensing electrode. That is, the mesh pitch of the wire electrode is half of the mesh pitch of the sensing electrode.

Accordingly, a wire width of one wire electrode connected to one sensing electrode can be decreased. Therefore, a non-touch area according to the wire width of the wire electrode disposed on the effective area can be reduced.

In addition, a different wire electrode, in other words, a different wire electrode connected to a different sensing electrode is complementarily formed with an adjacent wire electrode to form a shape, in which two wire electrodes are combined, and a shape of the sensing electrode into a same mesh shape such that the wire electrode and the sensing electrode, which are formed of metal, are prevented from being visually recognized from the outside, so that the visibility of the touch window can be improved.

Therefore, the touch window according to the embodiment can increase the touch area and improve the visibility by decreasing the width of the wire electrode.

In addition, according to the touch window of the embodiment, the sensing electrode and the wire electrode can be realized in a mesh shape, and the size of the mesh shape of the sensing electrode and the mesh shape of the wire electrode can be controlled and the width of the wire electrode can be controlled to improve the reliability and the visibility of the touch window.

Further, by further providing a reinforcing wire inside the wire electrode, the sensing electrode and the wire electrode may be stably connected, thereby improving the reliability of the touch window.

In addition, according to the touch window of the embodiment, the interval and the width of the wire electrodes disposed on the active area can be controlled.

In detail, by making the width of the wire electrode twice larger than the pitch of the mesh electrode in the wire electrode, the mesh electrodes in the wire electrode can be prevented from being shorted with each other.

For this reason, the touch window according to the embodiment can improve the reliability.

In addition, by controlling the width of the wire electrodes within a predetermined range, the wire electrodes in the active area may be prevented from being visually recognized from the outside, and the wire electrodes can be prevented from being shorted with each other.

For this reason, the touch window according to the embodiment can improve the reliability and visibility.

BRIEF DESCRIPTION OF DRAWINGS

FIG. 1 is a perspective view showing a touch window according to the first embodiment.

FIG. 2 is a top view showing the touch window according to the first embodiment.

FIG. 3 is an enlarged view showing portion A of FIG. 2.

FIG. 4 is a perspective view showing the touch window according to the second embodiment.

FIG. 5 is a top view showing the touch window according to the second embodiment.

FIG. 6 is an enlarged view showing portion A of FIG. 2, in which a wire electrode according to the third embodiment is enlarged.

FIG. 7 is an enlarged view showing portion A of FIG. 2, in which the wire electrode according to the third embodiment is enlarged.

FIG. 8 is an enlarged view showing portion A of FIG. 2, in which the wire electrode according to the fourth embodiment is enlarged.

FIG. 9 is an enlarged view showing portion A of FIG. 2, in which another wire electrode according to the fourth embodiment is enlarged.

FIG. 10 is an enlarged view showing portion A of FIG. 2, in which yet another wire electrode according to the fourth embodiment is enlarged.

FIG. 11 is an enlarged view showing the wire electrode of the touch window according to the fifth embodiment.

FIGS. 12 to 14 are views illustrating a process of forming a sensing electrode and/or the wire electrode according to the embodiment.

FIGS. 15 to 16 are views illustrating a touch device in which the touch window and a display panel are combined according to the embodiment.

FIGS. 17 to 20 are views showing examples of the touch device equipment to which the touch device according to the embodiment is applied.

MODE FOR THE INVENTION

In the description of the embodiments, it will be understood that, when a substrate, a layer (or film), a region, a pad or a pattern is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

In the following description, when a part is connected to the other part, the parts are not only directly connected to each other, but also indirectly connected to each other while interposing another part therebetween. In addition, when a predetermined part "includes" a predetermined component, the predetermined part does not exclude other components, but may further include other components unless otherwise indicated.

The thickness and size of each layer (or film), each region, each pattern, or each structure shown in the drawings may be modified for the purpose of convenience or clarity of the explanation. In addition, the size of elements does not utterly reflect an actual size.

Referring to FIGS. 1 and 5, a touch window according to the embodiment may include a substrate 100, a sensing electrode 300, a wire electrode 400 and a printed circuit board 500.

The substrate 100 may be flexible or rigid.

For example, the substrate 100 may include glass or plastic. In detail, the substrate 100 may include chemically tempered/semi-tempered glass, such as soda lime glass or aluminosilicate glass, reinforced/flexible plastic, such as polyimide (PI), polyethylene terephthalate (PET), propylene glycol (PPG), or poly carbonate (PC), or sapphire.

In addition, the substrate 100 may include an optically isotropic film. For example, the substrate 100 may include cyclic olefin copolymer (COC), cyclic olefin polymer (COP), optically isotropic polycarbonate (PC), or optically isotropic polymethyl methacrylate (PMMA).

The sapphire has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

In addition, the substrate 100 may be partially bent to have a curved surface. That is, the substrate 100 may have a partial flat surface and a partial curved surface. In detail, an end of the substrate 100 may be bent to have a curved surface or may be bent or flexed to have a surface including a random curvature.

Further, the substrate 100 may include a flexible substrate having a flexible property.

Further, the substrate 100 may include a curved or bended substrate. That is, the touch window including the substrate 100 may be formed to have a flexible, curved or bended property. For this reason, the touch window according to the embodiment may be easily portable and may be variously changed in design.

The sensing electrode, the wire electrode and the printed circuit board may be disposed on the substrate 100.

The substrate 100 may include a cover substrate. That is, the sensing electrode, the wire electrode and the printed circuit board may be disposed on the cover substrate. Alternately, a separate cover substrate may further be disposed on the substrate. In other words, the sensing electrode, the wire electrode and the printed circuit board may be supported by the substrate, and the substrate and the cover substrate may be stacked or bonded through a bonding layer.

The substrate 100 may have an active area AA and an unactive area UA defined therein.

An image may be displayed in the active area AA and the image may not be displayed in the unactive area UA provided around the active area AA.

In addition, the position of an input device (e.g., finger or a stylus pen) may be sensed in at least one of the active area AA and the unactive area UA. If the input device, such as a finger, touches the touch window, the variation of capacitance occurs in the touched part by the input device, and the touched part subject to the variation of the capacitance may be detected as a touch point.

The sensing electrode 300 may be disposed on the substrate 100. In detail, the sensing electrode 300 may be disposed on at least one of the active area AA and the unactive area UA of the substrate 100. Preferably, the sensing electrode 300 may be disposed on the active area AA of the substrate 100.

The sensing electrode 300 may include the first and second electrodes 310 and 320.

The first and second sensing electrodes 310 and 320 may be disposed on one surface of the substrate 100. In detail, the first and second sensing electrodes 310 and 320 may be disposed on the same surface of the substrate 100. That is, the first and second sensing electrodes 310 and 320 may be disposed on the same one surface of the substrate 100 and spaced apart from each other such that the first and second sensing electrodes 310 and 320 do not make contact with each other.

The sensing electrode 300 may include a transparent conductive material which allows electricity to flow therethrough without interfering with light transmission. For instance, the sensing electrode 300 may include metal oxide, such as indium tin oxide, indium zinc oxide, copper oxide, tin oxide, zinc oxide, or titanium oxide.

Alternately, the sensing electrode 300 may include a nanowire, a photosensitive nanowire film, carbon nanotube (CNT), graphene, conductive polymer or a mixture thereof.

If a nano composite, such as a nano wire or CNT, is used, the sensing electrode or the wire electrode may have a black color. In this case, it is possible to control the color and the reflectivity while ensuring electric conductivity by controlling the content of nano powder.

Alternately, the sensing electrode 300 may include various metals. For example, the sensing electrode 300 may include at least one of Cr, Ni, Cu, Al, Ag, Mo, Au, Ti and an alloy thereof.

The sensing electrode 300 may be arranged in a form of a mesh. In detail, the sensing electrode 300 may include a plurality of sub electrodes, and the sub electrodes may form a first mesh electrode which is arranged in the form of a mesh in which sub electrodes intersect with each other.

In detail, referring to FIG. 3, the sensing electrode 300 may include a first mesh line LA1 and a first mesh opening part OA1 between the first mesh line LA1 by the sub electrodes arranged in the form of a mesh and intersecting with each other.

The first mesh opening part OA1 may have various shapes. For example, the mesh opening part OA may have various shapes such as a polygonal shape including a rectangular shape, a diamond shape, a pentagon shape, or a hexagonal shape, or a circular shape. In addition, the first mesh opening part OA1 may have a regular shape or a random shape.

The sensing electrode may be formed in a form of a mesh, so that the sensing electrode pattern may not be visually recognized on the active area AA or the unactive area UA. That is, even though the sensing electrode is formed of metal, the pattern may not be viewed. In addition, even if the sensing electrode is applied to a large-size touch window, the resistance of the touch window may be lowered.

Since the sensing electrode 300 is arranged in the form of a mesh having the first line LA1 and the first opening part OA1, the sensing electrode 300 may have a first mesh pitch P1 and a first mesh line width LW1.

In this case, the mesh pitch may signify a distance between the mesh lines. In detail, the mesh pitch may be defined as a distance between one mesh line and another mesh line connected to each other. Alternately, the mesh pitch may be defined as a distance between contact points of the mesh line and other mesh lines.

The first mesh line width LW1 may be equal to or less than about 10 μm. For example, the first mesh line width LW1 may exceed about 0 μm and equal to or less than about 10 μm.

In detail, the first mesh line width LW1 may exceed about 0 μm and equal to or less than about 5 μm. In more detail, the first mesh line width LW1 may be about 1.5 μm to about 3 μm.

If the line width of the first mesh line LA1 exceeds about 10 μm, a sensing electrode pattern may be visually recognized from an outside, so that the visibility may be degraded.

In addition, the first mesh pitch P1 and the first mesh line width LW1 may satisfy at least one of the following equation 1 to equation 3. In detail, the first mesh pitch P1 and the first mesh line width LW1 may satisfy equation 2 and equation 3. In more detail, the first mesh pitch P1 and the first mesh line width LW1 may satisfy equation 1, equation 2 and equation 3.

$$\text{first mesh pitch} \geq 50 \times \text{first mesh line width} \quad \text{[Equation 1]}$$

$$0 < \text{first mesh pitch} < (100 \times \text{first line width})^{-1} \quad \text{[Equation 2]}$$

$$0 \leq \left[2 - \frac{\text{first mesh pitch} + 1}{50 \times \text{first mesh line width}}\right] < 1 \quad \text{[Equation 3]}$$

The equation 1 to the equation 3 are equations related to the visibility of the sensing electrode, and when the equations are not satisfied, the sensing electrodes may be visually recognized from an outside, so the visibility may be degraded. In other words, when the sensing electrode having a first mesh line width of equal to or less than 5 μm does not satisfy the equations 1 to 3, the transmittance of the sensing electrodes may degrade, so the sensing electrodes may be visually recognized from the outside, so the overall visibility may be degraded.

TABLE 1

|  | First mesh pitch(μm) | First mesh line width(μm) | Eaquation 3 value | Transmittance |
| --- | --- | --- | --- | --- |
| Embodiment1 | 30 | 1 | 1.38 | 70% |
| Embodiment2 | 50 | 1 | 0.98 | 90% |
| Embodiment3 | 80 | 1 | 0.38 | 92% |

That is, referring to Table 1, when the first mesh line width is 1 μm, the first mesh pitch is varied and the first mesh line width and the first mesh pitch are substituted in equation 3, each transmittance becomes different. In other words, in the case of the embodiments 2 and 3, which satisfy equation 3, the transmittance is equal to or higher than about 90%, so the sensing electrodes may not be visually recognized from the outside. However, in the case of the embodiment 1, which does not satisfy equation 3, the transmittance is low, so the sensing electrodes may be visually recognized from the outside The wire electrode 400 may be arranged in a form of a mesh. In detail, the wire electrode 400 may include a plurality of sub electrodes, and the sub electrodes may form a second mesh electrode which is arranged in the form of a mesh in which sub electrodes intersect with each other.

Referring to FIG. 3, the wire electrode includes a second mesh line LA2, and a mesh opening part OA2 may be formed by the second mesh line LA2. The second mesh opening part OA2 may have various shapes. For example, the second mesh opening part OA2 may have various shapes such as a polygonal shape including a rectangular shape, a diamond shape, a pentagon shape, or a hexagonal shape, or a circular shape. In addition, the second mesh opening part OA2 may have a regular shape or a random shape.

The wire electrode 400 may include a first, second, third and fourth wire electrodes 410, 420, 430 and 440.

The first, second, third and fourth wire electrodes 410, 420, 430 and 440 may be spaced apart from each other by a predetermined distance. For example, as shown in FIGS. 2 and 3, the first, second, third and fourth wire electrodes 410, 420, 430 and 440 may be spaced apart from each other by a distance of a first interval S1, a second interval S2, and a third interval S3, respectively. The first interval S1, the second interval S2, and the third interval S3 may correspond to each other.

The first interval S1, the second interval S2, and the third interval S3 may be equal to or less than about 20 μm. In detail, the first interval S1, the second interval S2, and the third interval S3 may exceed 0 μm and be equal to or less than about 20 μm. When the first interval S1, the second interval S2, and the third interval S3 exceeds about 20 μm, a wire electrode pattern may be visually recognized from the outside, so the overall visibility may be degraded.

Each of the first, second, third and fourth wire electrodes 410, 420, 430 and 440 may have a predetermined width. For example, the first, second, third and fourth wire electrodes 410, 420, 430 and 440 may have first, second, third and fourth widths W1, W2, W3 and W4, respectively. The first, second, third and fourth widths W1, W2, W3 and W4 may correspond to each other.

In addition, the first, second, third and fourth widths W1, W2, W3 and W4 may be related to the second mesh pitch P2 of the wire electrode 410. For example, the first width W1 and the second mesh pitch P2 may satisfy the following equation 4.

$$\text{first width} \geq \sqrt{2} \times \text{second mesh pitch} \quad [\text{Equation 4}]$$

Alternately, the first width W1 and the second mesh pitch P2 may satisfy the following equation 5, and in this case, the first width and the first interval may satisfy the following equation 6.

$$\text{first width} < \sqrt{2} \times \text{second mesh pitch} \quad [\text{Equation 5}]$$

$$\text{first width} \geq 50 \times \text{first interval} \quad [\text{Equation 6}]$$

For example, the first width W1 and the second mesh pitch P2 may satisfy equation 4 or the first width W1 and the second mesh pitch P2 may satisfy equation 5 and equation 6.

Equations 4 to 6 are conditions for the wire electrode arranged in the form of a mesh to be visually unrecognized from the outside, so when the equations are not satisfied, the wire electrodes may be visually recognized from the outside, so the overall visibility may be degraded.

In addition, the first width W1 and the first interval S1 of the wire electrode may satisfy the following equation 7.

$$0 \leq \left[ 2 - \frac{\text{first width} + 1}{50 \times \text{first interval}} \right] < 1 \quad [\text{Equation 7}]$$

The equation 7 is related to the visibility of the sensing electrode, and when the equation is not satisfied, the wire electrodes may be visually recognized from an outside, so the visibility may be degraded. In other words, when the sensing electrode having the first interval of equal to or less than 20 μm does not satisfy the equation 7, the sensing electrodes may be visually recognized from the outside, so the overall visibility may be degraded.

TABLE 2

| | First width(μm) | First interval(μm) | Eaquation 7 value | Transmittance(%) |
|---|---|---|---|---|
| Embodiment 1 | 30 | 1 | 1.38 | 70% |
| Embodiment 2 | 50 | 1 | 0.98 | 92% |
| Embodiment 3 | 80 | 1 | 0.38 | 94% |

That is, referring to Table 2, when the interval of the wire electrodes is 1 μm, the width of the wire electrode is varied and the interval and the width of the wire electrode are substituted in equation 7, each transmittance becomes different. In other words, in the case of the embodiments 2 and 3, which satisfy equation 7, the transmittance is equal to or higher than about 90%, so the wire electrode may not be visually recognized from the outside. However, in the case of the embodiment 1, which does not satisfy equation 7, the transmittance is low, so the wire electrodes may be visually recognized from the outside FIGS. 4 to 5 are views showing the touch window according to the second embodiment. In the following description of the touch window according to the second embodiment, the detailed descriptions about the parts similar or identical to those described in the touch windows of the first embodiment will be omitted in order to avoid redundancy.

Referring to FIGS. 4 to 5, the touch window according to the second embodiment may include a first substrate 210, and a second substrate 220 on the first substrate 210.

The sensing electrode and the wire electrode arranged in the form of a mesh may be disposed on one surface of the first substrate 210 and one surface of the second substrate 220. For example, the first sensing electrode and the first wire electrode may be disposed on the one surface of the first substrate 210 and the second sensing electrode and the second wire electrode may be disposed on the one surface of the second substrate 220.

At least one of the first and second sensing electrodes 210 and 220 may be a cover substrate. In detail, the first substrate 210 may be the cover substrate, and the sensing electrode and the wire electrode may be disposed on the one surface of the first substrate 210 and the one surface of the second substrate 220, respectively.

Alternately, a cover substrate (not shown) may be further disposed on the first substrate 210. In detail, the cover substrate may be further disposed on the first substrate 210, and the sensing electrode and the wire electrode may be disposed on the one surfaces of the first and second substrates 210 and 220, respectively.

According to the touch window of the second embodiment, in contrast with the first embodiment, the wire electrode 400 may be connected to the sensing electrode 300 and the wire electrode 400 may be withdrawn and extended toward the unactive area AA.

Descriptions with respect to the first mesh pitch of the sensing electrode, the equation and size of the first mesh line width, the width and interval of the wire electrode and the second mesh pitch are same as the touch window according to the first embodiment, so the description is omitted.

Hereinafter, the touch window according to the third embodiment will be described with reference to FIGS. 6 and 7. In the following description of the touch window according to the third embodiment, the detailed descriptions about the parts similar or identical to those described in the touch windows of the first embodiment will be omitted in order to avoid redundancy. In addition, in the following description of the touch window according to the third embodiment, the elements similar or identical to those in the touch windows of the first embodiment will be assigned same reference numbers.

In detail, referring to FIGS. 6 and 7, at least one of the first and second sensing electrodes 310 and 320 may include mesh lines LA by the sub electrodes crossing each other in a form of a mesh and a mesh opening part OA between the mesh line LA.

In addition, the sensing electrode 300 arranged in the form of a mesh may have a first mesh shape having a first mesh pitch. That is, a distance between the mesh line of the sensing electrode 300 and the mesh line may be defined as the first mesh pitch P1.

The sensing electrode may be arranged in the form of a mesh, so that the sensing electrode pattern may not be viewed on the active area AA. That is, even though the sensing electrode is formed of metal, the pattern may not be visually recognized. In addition, even if the sensing electrode is applied to a large-size touch window, the resistance of the touch window may be lowered.

The wire electrode 400 may be connected to the sensing electrode 300. The wire electrode 400 may be disposed on at least one of the active area AA and the unactive area UA of the substrate 100. In detail, the wire electrode 400 may be disposed on the active area AA and the unactive area UA of the substrate 100. That is, the wire electrode 400 may extend toward the active area AA of the substrate 200.

The wire electrode 400 may extend toward the unactive area and be connected to the printed circuit board 500. In addition, the wire electrode 400 may be provided on the same one surface of the substrate 100 on which the first and second sensing electrodes 310 and 320 are disposed.

Further, the wire electrode 400 may include a material which is similar to or the same as a material constituting the sensing electrode. Referring to FIG. 6, as described above, the wire electrode 400 may be arranged in the form of a mesh, same as the sensing electrode 300. In detail, the wire electrode 400 may be arranged in a form of a second mesh having a second mesh pitch. That is, a distance between the mesh line of the sensing electrode 400 and the mesh line may be defined as the second mesh pitch P2.

The first mesh pitch of the first mesh shape of the sensing electrode 300 and the second mesh pitch P2 of the second mesh shape of the wire electrode 400 may have mutually different sizes. In detail, the second mesh pitch P2 may be smaller than the first mesh pitch P1. For example, the second mesh pitch P2 may be 0.1 to 0.9 times the first mesh pitch P1. Alternately, the second mesh pitch P2 may be 0.2 to 0.8 times the first mesh pitch P1. Alternately, the second mesh pitch P2 may be 0.3 to 0.6 times the first mesh pitch P1.

Alternately, the second mesh pitch P2 may be 0.5 times the first mesh pitch P1. That is, the second mesh pitch P2 may be half of the first mesh pitch P1.

Referring to FIG. 7, the wire electrode may include first, second, third and fourth wire electrodes 410, 420, 430 and 440.

In detail, the wire electrode 400 may include the first wire electrode 410 having the second mesh shape of the second pitch P2, the second wire electrode 420 having a third mesh shape of a third pitch P3, the third wire electrode 430 having a fourth mesh shape of a fourth pitch P4 and the fourth wire electrode 440 having a fifth mesh shape of a fifth pitch P5.

The first wire electrode 410 to the fourth wire electrode 440 may be connected to different sensing electrodes, respectively, and extend from the active area to the unactive area, in other words to a same direction.

The wire electrodes may be spaced apart from each other by an interval of about 3 µm. In detail, the interval between the first and second wire electrodes 410 and 420, the interval between the second and third wire electrodes 420 and 430 and the interval between the third and fourth wire electrodes 430 and 440 may be about 3 µm.

In addition, the sensing electrode 300 may be arranged in the first mesh shape having the first mesh pitch P1.

The first mesh shape may have be different from at least one among the second mesh shape, the third mesh shape, the fourth mesh shape and the fifth mesh shape. In detail, the first mesh shape may be different from the second mesh shape, the third mesh shape, the fourth mesh shape and the fifth mesh shape.

In addition, the second mesh shape, the third mesh shape, the fourth mesh shape and the fifth mesh shape may have the same shape or different shapes. In detail, the second mesh shape and the third mesh shape may have shapes complementary to each other. In addition, the fourth mesh shape and the fifth mesh shape may have shapes complementary to each other.

In other words, a shape in which the second mesh shape and the third mesh shape are combined and a shape in which the fourth mesh shape and the fifth mesh shape are combined may be substantially same as the first mesh shape.

In addition, the first mesh pitch P1 may be different from at least one among the second mesh pitch P2, the third mesh pitch P3, the fourth mesh pitch P4 and the fifth mesh pitch P5. In detail, the first mesh pitch P1 may be different from the second mesh pitch P2, the third mesh pitch P3, the fourth mesh pitch P4 and the fifth mesh pitch P5. In more detail, the first mesh pitch P1 may be larger than the second mesh pitch P2, the third mesh pitch P3, the fourth mesh pitch P4 and the fifth mesh pitch P5.

In addition, the first mesh pitch P1 may be substantially same as a sum of the second mesh pitch P2 and the third mesh pitch P3. Alternately, the first mesh pitch P1 may be substantially same as a sum of the fourth mesh pitch P4 and the fifth mesh pitch P5. Alternately, the sum of the second mesh pitch P2 and the third mesh pitch P3 may be substantially same as the sum of the fourth mesh pitch P4 and the fifth mesh pitch P5.

"Substantially same" not only signifies that the length of the mesh pitch is completely the same but also includes the case in which the length of the pitch minutely differ due the fabricating process, tolerance and other variables.

That is, the sum of the length of the second mesh pitch P2 and the length of the third mesh pitch P3 may correspond to the sum of the length of the fourth mesh pitch P4 and the length of the fifth mesh pitch P5.

The touch window according to the third embodiment may include the wire electrode having the mesh pitch smaller than the mesh pitch of the sensing electrode. For example, the mesh pitch of the wire electrode according to the embodiment may be 0.5 times the mesh pitch of the sensing electrode. That is, the mesh pitch of the wire electrode according to the embodiment may be half of the mesh pitch of the sensing electrode.

Accordingly, the width of one wire electrode connected to one sensing electrode may be decreased. Therefore, the unactive area may be reduced according to the width of the wire electrode disposed on the active area.

In addition, a different wire electrode, in other words, a different wire electrode connected to a different sensing electrode is complementarily formed such that a shape in which two wire electrodes are combined and a shape of the sensing electrode are arranged in the same form of a mesh, so the wire electrode and the sensing electrode, which are formed of metal, may be prevented from being visually recognized from the outside, so the visibility of the touch window may be improved.

Therefore, the touch window according to the third embodiment may reduce the width of the wire electrode such that a touch area may be increased and the visibility may be improved.

Hereinafter, the touch window according to the fourth embodiment will be described with reference to FIGS. 8 to 10. In the following description of the touch window according to the fourth embodiment, the detailed descriptions about the parts similar or identical to those described in the touch windows of the first to third embodiments will be omitted in order to avoid redundancy. In addition, in the following description of the touch window according to the fourth embodiment, the elements identical to those described in the touch windows of the first to third embodiments will be assigned identical reference numbers.

Referring to FIG. 8, according to the touch window of the fourth embodiment, the sensing electrode 300 includes a first mesh electrode having a first mesh pitch P1, and the wire electrode 400 may include a second mesh electrode having a second mesh pitch P2.

The first mesh pitch P1 and the second mesh pitch P2 may be different. In detail, the first mesh pitch P1 may be larger than the second mesh pitch P2. In other words, the mesh pitch of the sensing electrode 300 may be larger than the mesh pitch of the wire electrode 400.

Accordingly, according to the touch window of the fourth embodiment, the mesh pitch of the wire electrode is smaller than the mesh pitch of the sensing electrode so more strands of meshes may be secured in the wire electrode thereby securing a sufficient surface resistance. In addition, the wire electrode disposed in the active area may be prevented from being visually recognized, and the moire effect by the wire electrode may be prevented.

Referring to FIG. 9, according to the touch window of the fourth embodiment, the wire electrode 400 may have a predetermined width. The width W of the wire electrode 400 may be different from the first mesh pitch P1. In detail, the width W of the wire electrode 400 may be larger than the first mesh pitch P1. In detail, the width W of the wire electrode 400 may be equal to or larger than twice the first mesh pitch P1. In more detail, the width W of the wire electrode 400 may be equal to or larger than $2\sqrt{2}$ times larger than the first mesh pitch P1.

The width W of the wire electrode is defined as a value in which at least one mesh form may enter into the wire electrode without being disconnected. When the mesh shape of the sensing electrode is a diamond shape, and the length of the mesh lines are 1, the value of one mesh shape able to enter the wire electrode without being disconnected is $\sqrt{2}$ according to the trigonometric function definition. In this case, to realize two mesh shapes to enter the wire electrode without being disconnected, the value is $\sqrt{2}$ multiplied by 2.

Since the width W of the wire electrode is equal to or larger than about $2\sqrt{2}$ times larger than the width of the first mesh pitch, the mesh shape in the wire electrode may be connected without being disconnected so the wire electrode may be stably formed thereby improving the reliability of the touch window.

Referring to FIG. 10, another touch window of the fourth embodiment may further include a reinforcing wiring 450 in the wire electrode. The reinforcing wiring 450 may be separated into at least two areas. In detail, the reinforcing wiring 450 may be classified as a connecting part 450a to connect the sensing electrode 300 and the wire electrode 400 and an extending part 450b extending from the connecting part.

In this case, the connecting part 450a of the reinforcing wiring 450 may have a predetermined length. In detail, the connecting part 450a may be equal to or larger than $2\sqrt{2}$ times larger than the first mesh pitch P1 of the sensing electrode.

In this case, the length of the connecting part 450a of the reinforcing wiring 450 is defined as a value in which the reinforcing wiring may be connected to at least one mesh shape of the sensing electrode without being disconnected. When the mesh shape of the sensing electrode is a diamond shape, and the length of the mesh lines are 1, the value of one mesh shape able to enter the wire electrode without being disconnected is $\sqrt{2}$ according to the trigonometric function definition. In this case, to realize two mesh shapes to enter the wire electrode without being disconnected, the value is multiplied by 2.

In addition, the extending part 450b may be disposed at a central part inside the wire electrode. In other words, the extending part 450b may be connected to the connecting part 450a to extend toward one direction from the central part inside the wire electrode.

Since the length of the connecting part 450a of the wire electrode is equal to or larger than about $2\sqrt{2}$ times larger than the width of the first mesh pitch, the sensing electrode and the wire electrode may be stably connected thereby improving the overall reliability of the touch window.

In addition, at least one reinforcing wiring 450 may be disposed in the wire electrode. Accordingly, the sensing electrode and the wire electrode are prevented from being shorted, thereby improving the reliability of the touch window.

Hereinafter, a touch window according to the fifth embodiment will be described with reference to FIG. 11. In the following description of the touch window according to the fifth embodiment, the detailed descriptions about the parts similar or identical to those described in the touch windows of the first to fourth embodiments will be omitted in order to avoid redundancy. In addition, in the following description of the touch window according to the fifth embodiment, the elements identical to those described in the touch windows of the first to fourth embodiments will be assigned identical reference numbers.

Referring to FIG. 11, the sensing electrode may include a first mesh line LA1 formed by a plurality of sub electrodes intersecting with each other. In addition, the sensing electrode may include a first mesh opening part OA1 between the first mesh line LA1.

The first mesh line LA1 may have a predetermined pitch. For example, the sensing electrode 300 may include a first mesh line LA1 having a first mesh pitch P1.

The first mesh pitch P1 may be equal to or less than about 100 μm.

Referring to FIG. 11, the first sensing electrode 310 may include a first sub-first sensing electrode 310a and a second sub-second sensing electrode 320a, which extend toward one direction, The first sub-first sensing electrode 310a and the second sub-second sensing electrode 310b may be spaced apart from each other.

The wire electrode 400 may be connected to the sensing electrode 300. The wire electrode 400 may be disposed on the substrate 100. For example, the wire electrode 400 may be disposed on at least one of the active area AA and the unactive area UA of the substrate 100. For example, the wire electrode 400 may be disposed on the active area AA and the unactive area UA of the substrate 100.

For example, one end of the wire electrode 400 may be connected to the sensing electrode 300, and the other end of the wire electrode 400 may be connected to the printed circuit board 400 disposed on the unactive area UA of the substrate 100.

In detail, the wire electrode 300 may be connected to the sensing electrode 200 on the active area UA of the substrate 100, and connected to the printed circuit board 500 on the unactive area AA of the substrate.

The printed circuit board 500 may include a drive IC. Accordingly, a touch signal detected by the sensing electrode 300 is transferred to the wire electrode 400, and the touch signal is transferred to the drive IC to perform an operation according to the touch.

The wire electrode 400 may include the first and second electrodes 410 and 420. For example, the wire electrode 400 may include the first wire electrode 410 connected to the first sensing electrode 310 and the second wire electrode 420 connected to the second sensing electrode 320.

The wire electrode 400 may include a material which is similar to or the same as a material constituting the sensing electrode 300. In addition, the wire electrode 400 may entirely be arranged in the form of a mesh by the sub electrodes intersecting with each other.

The wire electrode may be arranged in the form of a mesh, so that the wire electrode pattern may not be visually recognized on the active area AA. That is, even though the sensing electrode is formed of metal, the pattern may not be viewed.

The wire electrode 400 may include a second mesh line LA2 formed by the plurality of sub electrodes intersecting with each other. In addition, the wire electrode may include a second mesh opening part OA2 between the second mesh line LA2.

The second mesh line LA2 may have a predetermined pitch. For example, the wire electrode 400 may include the second mesh line LA2 having a second mesh pitch P2.

The second mesh pitch P2 may be equal to or less than about 100 μm. In addition, the second mesh pitch P1 and the first mesh pitch may correspond to each other.

In addition, the width W of the wire electrode 400 may be related to the size of the second mesh pitch P2. For example, the widths W1 and W2 of the wire electrode 400 and the size of the second mesh pitch P2 may be different. In detail, the widths W1 and W2 of the wire electrode 400 may be larger than the second mesh pitch P2.

For example, the widths W1 and W2 of the wire electrode 400 may be equal to or larger than one times the second mesh pitch P2. In detail, the widths W1 and W2 of the wire electrode 400 may be equal to or larger than about $\sqrt{2}$ times the second mesh pitch P2. In detail, the widths W1 and W2 of the wire electrode 400 may be about $\sqrt{2}$ times to 10 times larger than the second mesh pitch P2. In more detail, the widths W1 and W2 of the wire electrode 400 may be about $\sqrt{2}$ times to 5 times larger than the second mesh pitch P2.

When the widths W1 and W2 of the wire electrode 400 are smaller than about one times the second mesh pitch P2, the wire electrode may be shorted, and when exceeding about 10 times, the visibility may be reduced and the unactive area, that is, the non-display area, in other words, the non-touch area may increase due to the width of the wire electrode.

The first wire electrode 410 may be connected to a plurality of sub-first sensing electrodes. For example, referring to FIG. 11, the first wire electrode 410 may include a first sub-first wire electrode 410a to connect to the first sub-first sensing electrode 310a and a second sub-first wire electrode 410b to connect to the second sub-first sensing electrode 310b.

The first sub-first wire electrode 410a and the second sub-second wire electrode 420b may be spaced apart from each other. For example, a separation distance D between the first sub-first wire electrode 410a and the second sub-first wire electrode 420b may be equal to or smaller than about 20 μm. In detail, the separation distance D between the first sub-first wire electrode 410a and the second sub-first wire electrode 420b may be equal to or smaller than about 12 μm. In more detail, the separation distance D between the first sub-first wire electrode 410a and the second sub-first wire electrode 420b may be from about 3 μm to about 12 μm. In detail, the separation distance D between the first sub-first wire electrode 410a and the second sub-first wire electrode 420b may be from about 3 μm to about 7 μm.

When the separation distance D between the first sub-first wire electrode 410a and the second sub-first wire electrode 420b exceeds about 20 μm, a part in which the wire electrode is disposed and a part in which the wire electrode is not disposed on the substrate may be visually recognized from the outside, so the visibility of the touch window may be degraded. In addition, when the separation distance D between the first sub-first wire electrode 410a and the second sub-first wire electrode 420b is smaller than about 3 μm, a short circuit may occur between the wire electrodes and migrations may occur between the wire electrodes, so the visibility of the touch window may be degraded.

Hereinafter, the present invention is described in more detail through embodiments and comparison examples. The embodiments are provided only as examples to describe the present invention in further detail. Therefore the present invention is not limited to the embodiments.

Embodiment 1

The sensing electrode is disposed on the active area of the substrate, and the wire electrode is disposed on the active area and the unactive area so that the wire electrode is connected to the sensing electrode on the active area and the printed circuit board on the unactive area to fabricate the touch window. Then, whether the electrode in the wire electrode is disconnected is measured.

In this case, the wire electrode includes copper, is arranged in the form of a mesh having the pitch of about 100 μm, and the width of the wire electrode is about 210 μm.

Embodiment 2

Except for the wire electrode being arranged in the form of a mesh having the pitch of about 120 μm, and the width of the wire electrode is about 250 μm, the touch window is fabricated identical to the embodiment 1.

Comparison Example 1

Except for the wire electrode being arranged in the form of a mesh having the pitch of about 100 μm, and the width of the wire electrode is about 90 μm, the touch window is fabricated identical to the embodiment 1.

Comparison Example 2

Except for the wire electrode being arranged in the form of a mesh having the pitch of about 120 μm, and the width of the wire electrode is about 150 μm, the touch window is fabricated identical to the embodiment 1.

TABLE 3

|  | Electrode in the wire electrode disconnected? |
| --- | --- |
| Embodiment1 | No |
| Embodiment2 | No |
| Comparison example1 | Yes |
| Comparison example2 | Yes |

Embodiment 3

The sensing electrode is disposed on the active area of the substrate, and the wire electrode is disposed on the active area and the unactive area so that the wire electrode is connected to the sensing electrode on the active area and the printed circuit board on the unactive area to fabricate the touch window. Then, whether the electrodes are visually recognized and whether the migration occurred are measured.

In this case, the interval between the wire electrodes is about 3 μm.

Embodiment 4

Except for the interval between the wire electrodes being about 12 μm, the touch window is fabricated identical to the embodiment 3.

Comparison Example 3

Except for the interval between the wire electrodes being about 22 μm, the touch window is fabricated identical to the embodiment 3.

Comparison Example 4

Except for the interval between the wire electrodes being about 1 μm, the touch window is fabricated identical to the embodiment 3.

TABLE 4

|  | Wire electrode visually recognized? | Migration occurred? |
| --- | --- | --- |
| Embodiment3 | No | No |
| Embodiment4 | No | No |
| Comparison example3 | Yes | Yes |
| Comparison example4 | Yes | Yes |

Referring to Table 3, when the width of the wire electrodes are equal to or larger than about $\sqrt{2}$ times the mesh pitch of the wire electrode, a disconnection of the mesh electrode of the wire electrode does not occur.

On the contrary, when the width is less than about $\sqrt{2}$ times the mesh pitch, the mesh electrode of the wire electrode is disconnected.

That is, according to the touch window of the embodiment, the width of the wire electrode and the size of the mesh pitch are controlled to prevent electrode disconnection, so the reliability of the touch window may be improved.

In addition, referring to Table 4, when the interval between the wire electrodes is from about 3 μm to about 12 μm, the wire electrode is not visually recognized from the outside and the migration between the wire electrodes do not occur.

On the contrary, when outside the range, the wire electrode is visually recognized and the migration occurs.

That is, in the touch window according to the embodiment, the interval between the wire electrodes is controlled, so the visibility and the reliability of the touch window may be improved.

FIGS. 12 to 14 are views illustrating a process of forming a sensing electrode and/or a wire electrode according to the embodiment.

Referring to FIG. 12, the sensing electrode and/or the wire electrode according to an embodiment may be formed in a mesh shape by etching a metallic layer M disposed on an entire surface of the substrate 100. For example, a Cu mesh electrode having an embossed mesh shape may be formed by etching a Cu layer after a metallic layer M such as Cu is deposited on the entire surface of the substrate 100 including polyethyleneterephthalate (PET).

In addition, referring to FIG. 13, for the sensing electrode and/or the wire electrode according to the embodiment, after forming a resin layer R including UV resin or thermosetting resin on the substrate 100 and forming an intaglio pattern P having the mesh shape on the resin layer R, metallic paste MP is filled in the intaglio pattern P. In this case, the intaglio pattern of the resin layer may be formed by performing an imprinting process using a mold having an embossed pattern.

The metallic paste 340 may include a metallic paste including at least one of Cr, Ni, Cu, Al, Ag, Mo, and the alloy thereof. Accordingly, the metallic paste is filled in the mesh-shaped intaglio pattern P and cured to form an intaglio metallic mesh electrode having the mesh shape.

In addition, referring to FIG. 14, in the sensing electrode and/or the wire electrode according to an embodiment, after forming a resin layer R including UV resin or thermosetting resin on the substrate 100, a nano-pattern and a micro-pattern having an embossed mesh shape are formed on the resin layer R. Then, a metal may be sputtered on the resin layer.

In this case, the embossed pattern of the resin layer may be formed by performing an imprinting process using a mold having an intaglio pattern.

Thereafter, by etching the metallic layer M formed on the nano-pattern P1 and the micro-pattern, only the metallic layer is removed from the nano-pattern, and only the metallic layer formed on the micro-pattern remains, so that the metallic electrode having the mesh shape may be formed.

In this case, when the metallic layer is etched, the difference in the etching rate between the nano-pattern 211 and the micro-pattern 212 may be made depending on the difference between the contact areas of the metallic layer with the nano-pattern and the micro-pattern. That is, since the contact area of the metallic layer with the micro-pattern is wider than the contact area of the metallic layer with the nano-pattern, the metallic layer M formed on the micro-pattern is less etched. In addition, as the etching is performed at the same etching rate, the metallic layer formed on the micro-pattern remains, and the metallic layer formed on the nano-pattern is etched and removed. Accordingly, the metallic electrode having the micro-pattern and the embossed mesh shape may be formed on the substrate 100.

The sensing electrode and/or the wire electrode of a touch window according to an embodiment may include a metallic layer and be formed in a mesh shape as shown in FIGS. 12 to 14 described above.

Hereinafter, a touch device coupled to the touch window and a display panel is described with reference to FIGS. 15 and 16.

Referring to FIG. 15, the touch device according to the embodiment may include the display panel 800 and the touch window disposed on the display panel. For example, the display panel and the touch window may be bonded through a bonding layer 700 including an optically clear adhesive (OCA).

For example, in FIG. 15, the touch device includes a cover substrate 101 and a substrate 100, wherein the cover substrate 101 and the substrate 100 are bonded through the bonding layer 700, and a touch window, in which a first sensing electrode 310 and the second sensing electrode 320 are spaced apart from each other on the substrate 100, and the display panel 800 are bonded through the bonding layer 700, but the embodiment is not limited to thereto and the cover substrate 1010 may be omitted.

When the display panel 800 is a liquid crystal display panel, the display panel 800 may be formed by a liquid crystal layer interposed between a first substrate 810 including a TFT (Thin Film Transistor) and a pixel electrode and a second substrate 820 including a color filter layer.

In addition, the display panel 800 may be a liquid crystal display panel of a COT (color filter on transistor) structure in which the liquid crystal layer is interposed between the first substrate 810 including a TFT a color filter, and a black matrix and the second substrate 820. A TFT transistor may be formed on the first substrate 810, a protective layer may be formed on the TFT transistor and a color filter layer may be formed on the protective layer. In addition, the first substrate 810 is provided with a pixel electrode making contact with the TFT transistor. In this case, to improve an aperture ratio and simplify a mask process, the black matrix may be omitted, and a common electrode may perform a function of the black matrix together with the inherent function thereof.

In addition, when the display panel 800 is a liquid crystal display panel, the display panel may further include a backlight unit for providing light from a back surface of the display panel 800.

When the display panel 800 is an organic electroluminescence display panel, the display panel 800 may include a chemiluminescent device which does not require a separate light source. In the display panel 800, the TFT may be formed on the first substrate 810, and an organic luminescence device making contact with the TFT may be formed. The OLED may include an anode, a cathode and an organic light-emitting layer formed between the anode and the cathode. In addition, the display panel 800 may further include the second substrate 820 taking the role of an encapsulation substrate for encapsulation on the OLED.

Referring to FIG. 16, the first and second sensing electrodes 310 and 320 may be disposed on the display panel 800.

In other words, the touch device according to the embodiment may include a touch panel integrated with the display panel 600. In detail, the substrate supporting at least one sensing electrode may be omitted.

In detail, at least one sensing electrode may be disposed on at least one surface of the display panel 800. That is, at least one sensing electrode may be formed on at least one surface of the first substrate 810 or the second substrate 820.

For example, referring to FIG. 16, the bonding layer 700 is disposed between the cover substrate 101 and the display panel 800 such that the cover substrate and the display panel 800 are stacked, and the first and second sensing electrodes 310 and 320 may be disposed on the second substrate 820.

In addition, the cover substrate 101 may further include a polarizing plate at a lower part thereof. The polarizing plate may be a linear polarizing plate or an external light antireflection polarizing plate. For example, when the display panel 800 is an LCD panel, the polarizing plate may be a linear polarizing plate. In addition, when the display panel 800 is an organic electroluminescence display panel, the polarizing plate may be an external light anti-reflection polarizing plate.

Alternately, the cover substrate 101 may serve as the polarizing plate.

According to the touch device of FIG. 16, at least one substrate to support the sensing electrode may be omitted. Accordingly, the touch device may be thin and light.

In addition, even though not illustrated in the drawing, an anti-reflection layer may be disposed on at least one electrode among the first sensing electrode, the second sensing electrode, the first wire electrode and the second wire electrode of the touch device according to the embodiment.

For example, the anti-reflection layer may make contact with at least one surface of at least one electrode among the first sensing electrode, the second sensing electrode, the first wire electrode and the second wire electrode. For example, the anti-reflection layer may be provided only on an upper surface, only on a lower surface or make contact with the upper surface and the lower surface of at least one surface of at least one electrode among the first sensing electrode, the second sensing electrode, the first wire electrode and the second wire electrode.

The anti-reflection layer may be provided on one surface of at least one surface of at least one electrode among the first sensing electrode, the second sensing electrode, the first wire electrode and the second wire electrode to prevent the metal electrode from oxidation and prevent reflection due to the total reflection of metal. In addition, when the antireflection layer is proved on the lower surface of at least one electrode among the first sensing electrode, the second sensing electrode, the first wire electrode and the second wire electrode, the anti-reflection layer may improve the bonding strength of the electrode and the substrate.

The anti-reflection layer may be formed of a blackening material. The blackening material may be a black metallic oxide. For example, any one selected from CuO, CrO, FeO and $Ni_2O_3$ may be used, but is not limited thereto, and a black material able to suppress the reflection of the electrode may be used.

In addition, the anti-reflection layer and the electrodes may be simultaneously formed or formed by a separate process.

Hereinafter, one example of the display device to which the touch window according to the above-described embodiments is applied will be described with reference to FIGS. 17 to 20.

Referring to FIG. 17, a mobile terminal is shown as one example of the touch device. The mobile terminal may include the active area AA and the unactive area UA. The active area AA is a region in which a touch signal is sensed due to the touch by a finger, and an instruction icon pattern part and a logo may be formed in the unactive area UA.

Referring to FIG. 18, the touch window may include a flexible touch window that is bendable. Accordingly, the touch device including the touch window may be a flexible touch device. Accordingly, a user can curve or bend the flexible touch window with a hand.

Referring to FIG. 19, the touch window may be applied to a vehicle navigation system as well as the touch device of a mobile terminal.

In addition, referring to FIG. 20, the touch window may be applied to an inner part of a vehicle. In other words, the touch window may be applied to various parts in the vehicle. Accordingly, the touch window may be applied to a dashboard as well as a PND (Personal Navigation Display), so that a CID (Center Information Display) may be realized. However, the embodiment is not limited thereto, and the touch device may be used for various electronic appliances.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A touch window comprising:
a cover substrate;
a substrate on the cover substrate;
an optically clear adhesive between the cover substrate and the substrate,
a first sensing electrode on the substrate,
a second sensing electrode on the substrate, and spaced apart from the first sensing electrode;
a first wire electrode connected to the first sensing electrode; and
a second wire electrode connected to the second sensing electrode,
wherein at least one surface of the cover substrate includes a curved surface,
wherein the first sensing electrode, the second sensing electrode, the first wire electrode, and the second wire electrode are disposed on a same surface of the substrate,
wherein at least one of the first and second sensing electrodes includes a first mesh line, a second mesh line, and a mesh opening part between the first mesh line and the second mesh line,
wherein the first mesh line width is 1.5 μm to 3 μm, and
wherein an interval between the first wire electrode and the second wire electrode exceeds 0 μm and is equal to or less than 20 μm.

2. The touch window of claim 1, wherein the cover substrate includes a glass.

3. The touch window of claim 1, wherein at least one of the first and second sensing electrodes includes metal.

4. The touch window of claim 1, wherein at least one of the first and second sensing electrodes includes at least one of Cr, Ni, Cu, Al, Ag, Mo, and an alloy thereof.

5. The touch window of claim 1, wherein at least one of the first and second wire electrodes includes metal.

6. The touch window of claim 1, wherein the first sensing electrode, the second sensing electrode, the first wire electrode, and the second wire electrode includes a same material.

7. A touch device comprising:
a first substrate;
a thin film transistor on the first substrate;
an organic light emitting device on the thin film transistor;
an encapsulation layer on the organic light emitting device;
a touch electrode on the encapsulation layer;
a cover substrate on the touch electrode;
a polarizing plate over the cover substrate; and
an optically clear adhesive between the cover substrate and the second substrate,
wherein the organic light emitting device includes a self light-emitting device,
wherein the touch electrode includes:
a first sensing electrode on the encapsulation layer,
a second sensing electrode on the encapsulation layer, and spaced apart from the first sensing electrode,
a first wire electrode connected to the first sensing electrode,
a second wire electrode connected to the second sensing electrode,
wherein at least one surface of the cover substrate includes a curved surface,
wherein the first sensing electrode, the second sensing electrode, the first wire electrode, and the second wire electrode are disposed on a same surface of the encapsulation layer,
wherein at least one of the first and second sensing electrodes includes a first mesh line, a second mesh line, and a mesh opening part between the first mesh line and the second mesh line,
wherein the first mesh line width is 1.5 μm to 3 μm, and
wherein an interval between the first wire electrode and the second wire electrode exceeds 0 μm and is equal to or less than 20 μm.

8. The touch device of claim 7, wherein the cover substrate includes a glass.

9. The touch device of claim 7, wherein at least one of the first and second sensing electrodes includes metal.

10. The touch device of claim 7, wherein at least one of the first and second sensing electrodes includes at least one of Cr, Ni, Cu, Al, Ag, Mo, and an alloy thereof.

11. The touch device of claim 7, wherein at least one of the first and second wire electrodes includes metal.

12. The touch device of claim 7, wherein the first sensing electrode, the second sensing electrode, the first wire electrode, and the second wire electrode includes a same material.

* * * * *